United States Patent [19]  
Kaneshiro et al.

[11] 4,149,056  
[45] Apr. 10, 1979

[54] MICROWAVE OVEN WITH FOOD TEMPERATURE-SENSING MEANS

[75] Inventors: Tetuya Kaneshiro, Kashiwara; Takeshi Tanabe, Higashiosaka, both of Japan

[73] Assignee: Sharp Kabushiki Kaisha, Osaka, Japan

[21] Appl. No.: 794,090

[22] Filed: May 5, 1977

[30] Foreign Application Priority Data

May 13, 1976 [JP] Japan .................... 51-54927  
Jul. 27, 1976 [JP] Japan .................... 51-89859

[51] Int. Cl.² .............................. H05B 9/06  
[52] U.S. Cl. .................. 219/10.55 R; 99/421 TP; 73/352  
[58] Field of Search ........... 219/10.55 R, 10.55 B, 219/10.55 C, 10.55 D, 10.55 E; 73/352, 359, 362; 99/421 TP, 419

[56] References Cited  
U.S. PATENT DOCUMENTS

| 2,510,526 | 6/1950 | Smith | 99/421 TP |
| 3,177,335 | 4/1965 | Fitzmayer et al. | 219/10.55 R |
| 3,875,361 | 4/1975 | Fukui et al. | 219/10.55 B |
| 3,974,696 | 8/1976 | Fitzmayer | 219/10.55 E X |
| 3,988,929 | 11/1976 | White et al. | 219/10.55 R X |
| 3,988,930 | 11/1976 | Fitzmayer et al. | 219/10.55 R X |
| 3,991,615 | 11/1976 | Hornung | 219/10.55 R X |
| 4,038,510 | 7/1977 | White | 219/10.55 E |

FOREIGN PATENT DOCUMENTS 1126876 9/1968 United Kingdom ............ 219/10.55 F

Primary Examiner—Arthur T. Grimley  
Attorney, Agent, or Firm—Birch, Stewart, Kolasch & Birch

[57] ABSTRACT

A food temperature-sensing probe is included within a microwave oven for monitoring an internal temperature of the food while it is being cooked therein. A probe jack inserted into a slipping connector transmits a food temperature signal detected by the food temperature-sensing probe to monitor the internal temperature of the food. The slipping connector is arranged on a top wall of the microwave oven cavity. More particularly, on the top wall at the position approximately corresponding to the center of a turntable when a turntable is positioned within the microwave oven. In a preferred form, the connector is so constructed as to permit the rotation of the temperature-sensing probe in unison with the rotation of the turntable.

28 Claims, 10 Drawing Figures

MICROWAVE OVEN WITH FOOD TEMPERATURE-SENSING MEANS

BACKGROUND OF THE INVENTION

The present invention relates to a microwave oven including a food temperature-sensing probe for monitoring an internal temperature of the food while being cooked in a microwave oven, a connector of said probe being arranged on a top wall of a microwave oven.

A typical food temperature-sensing probe is disclosed in Louis H. Fitzmayer, U.S. Pat. No. 3,988,930 "MICROWAVE OVEN FOOD TEMPERATURE-SENSING PROBE", issued on Nov. 2, 1976.

The connector of the food temperature-sensing probe disclosed in the above U.S. Pat. No. 3,988,930 is mounted on a oven side wall. Such connector arrangement is not applicable to a microwave oven with a turntable because a flexible shield cable is damaged by the rotation of the turntable.

OBJECTS AND SUMMARY OF THE INVENTION

Accordingly, an object of the present invention is to provide a novel microwave oven including a food temperature-sensing probe monitoring an internal temperature of the food while being cooked in a microwave oven, a connector of said probe being arranged on a top wall of the oven cavity. Another object of the present invention is to provide a novel rotary and removable connector structure for a food temperature-sensing probe for monitoring an internal temperature of the food while being cooked in a microwave oven, a connector of said probe being arranged on a top wall thereof.

Still another object of the present invention is to provide a novel microwave oven with a turntable including a food temperature-sensing probe for monitoring an internal temperature of the food while being cooked in a microwave oven, a connector of said probe being arranged on a top wall approximately corresponding to the center of the turntable.

To achieve the above objects, pursuant to an embodiment of the present invention, a food temperature-sensing probe for monitoring an internal temperature of the food while being cooked in a microwave oven is provided within the microwave oven, a connector of said probe being arranged on a top wall thereof.

Monitoring an internal temperature of food with the probe controls a power supply to a microwave generator within a predetermined food temperature by a control signal introduced into a control unit including control circuitry.

A monitor equipment comprises a food temperature-sensing probe for monitoring an internal temperature of the food, a flexible, shielded cable for electrically connecting the food temperature-sensing probe to the control circuitry, and a probe jack inserted within a slipping connector structure for supporting the flexible, shielded cable, said connector being mounted on a top wall of a microwave oven cavity. The probe jack can be removable from the slipping connector structure. The probe jack is tightly combined with the slipping connector structure when the microwave oven does not have a turntable. When a microwave oven has a turntable, the probe jack rotates in unison with the rotation of the turntable in the slipping connector structure. In a preferred form, the slipping connector structure is arranged on the top wall approximately corresponding to the center of the turntable of the microwave oven when a microwave oven has a turntable.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
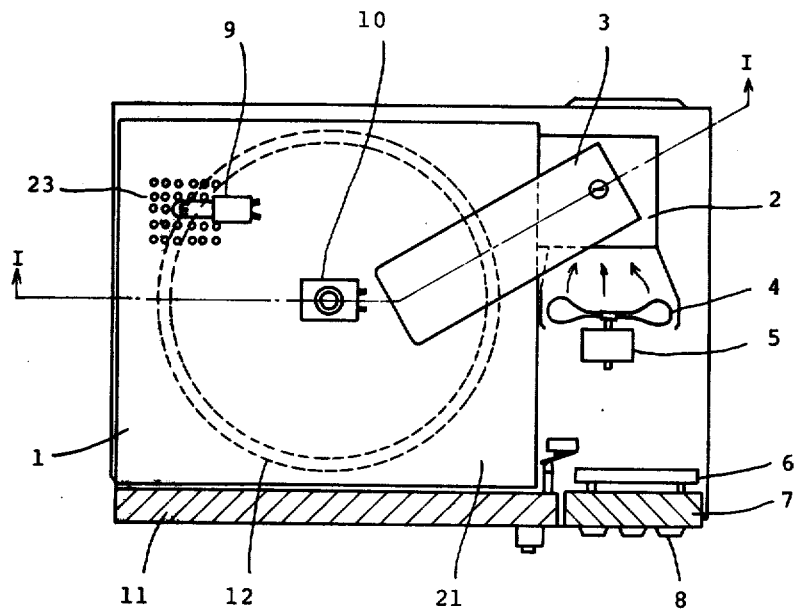
FIG. 1 is a sectional view of a microwave oven with a turntable including an embodiment of a food temperature-sensing means of the present invention.
Figure 2:
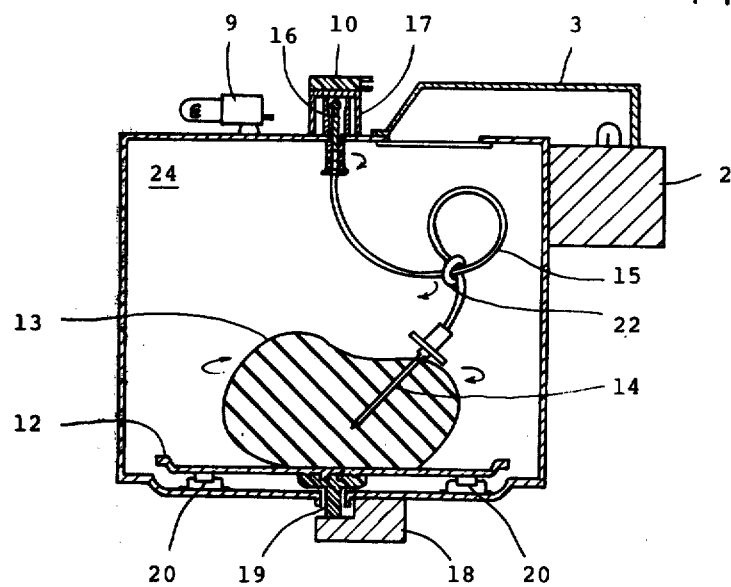
FIG. 2 is a sectional view taken on line I—I in FIG. 1.

FIG. 1 shows a microwave oven with a turntable including an embodiment of a food temperature-sensing means of the present invention, and FIG. 2 is a sectional view taken on line I—I in FIG. 1.

A microwave oven 1 mainly includes a magnetron 2, a waveguide 3, a fan blade 4, a fan motor 5, a control unit 6, a control panel 7, touch keys 8, an oven light 9, a slipping terminal unit 10, a latch door 11, and a turntable 12 as shown in FIG. 1.

The magnetron 2 generates the microwave energy through the waveguide 3 to cook food mounted on the turntable 12. A power source (not shown) for the magnetron 2 is controlled by the control unit 6 which is directed by the touch keys 8 on the control panel 7 by an operator's fingers. The control unit 6 comprises semiconductors such as Large Scale Integrated Circuits, Integrated Circuits, etc.

The microwave oven 1 also includes a food temperature-sensing probe plug 14, or a flexible, shielded cable 15, a probe jack 16, a slipping connector structure 17, a turntable motor 18, a strut 19, and freely rotating rollers 20 as shown in FIG. 2. Reference number 13 designates the food to be cooked. The food temperature-sensing probe 14 monitors an inner temperature of the food 13 mounted on the turntable 12 while it is being cooked. The food temperature signal detected by the food temperature-sensing probe 14 is transmitted to the probe jack 16 via the flexible, shielded cable 15. The probe jack 16 is rotatably and removably combined with the slipping connector structure 17.

The slipping connector structure 17 is arranged on a top wall 21 approximately corresponding to the center of the turntable 12 of the microwave oven 1. With such an arrangement the flexible, sheilded cable 15 connecting the food temperature-sensing probe 14 to the probe jack 16 is not damaged with the rotation of the food 13 on the turntable 12. The slipping terminal unit 10 is positioned on the slipping connector structure 17.

If the slipping connector structure 17 is not arranged on the top wall 21 approximately corresponding to the center of the turntable 12 of the microwave oven 1, the flexible, shielded cable 15 is damaged by the rotation of the food 13 mounted on the turntable 12 and, moreover, the smooth rotation of the food 13 will be distrubed.

The flexible, shielded cable 15 is fastened with an adjusting ring 22 made of polysulfone to permit adjustment of the distance between the food food temperature-sensing probe 14 and the probe jack 16. The turntable motor 18 drives the turntable 12 with the strut 19, said turntable 12 being supported by the freely rotating rollers 20. The oven light 9 illuminates an oven cavity 24 of the microwave oven 1 via apertures 23.

Figure 3:
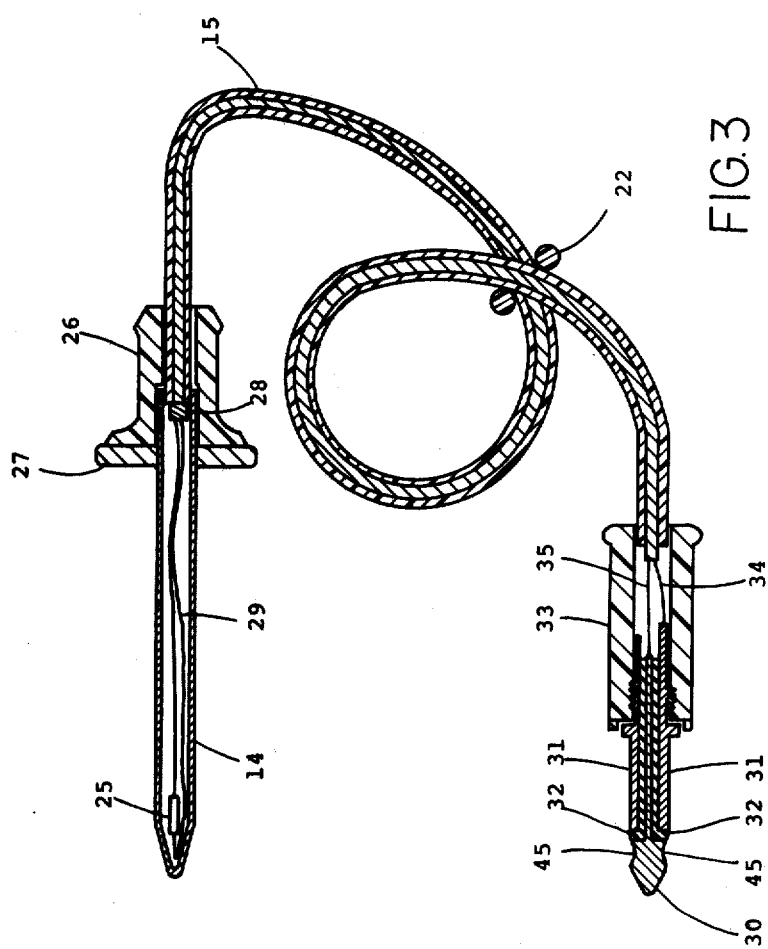
FIG. 3 is a sectional view of a monitor equipment including a food temperature-sensing probe, a flexible, shielded cable and a probe jack of the food temperature-sensing means of the present invention.

FIG. 3 shows a monitor equipment of the present invention. The food temperature-sensing probe 14 made of electrically conductive material of tubular shape includes a temperature-sensing element such as a thermister 25 located within the tip thereof. Said probe 14 is supported with a probe handle 26 attached to a reflector 27.

A cable 28 in the flexible, shielded cable 15 is electrically connected to the thermister 25 via a lead line 29 in the food temperature-sensing probe 14. Said probe 14 is adapted to be inserted into the food 13 for monitoring the inner temperature thereof in such a manner that the reflector 27 is adjacent to the food 13.

A probe jack 16 made of electrically conductive material, includes a top electrically conductive means 30 at the tip which is extended to the center axis thereof and side electrically conductive means 31 at the side thereof.

Insulator 32 in the probe jack 16 is held between the electrically conductive means 30 and 31 to insulate from each other. Said jack 16 has an indent 45 in the top electrical conductive means 30 just below the tip thereof. Said jack 16 is supported by a jack handle 33 together with the flexible, shielded cable 15 of a coaxial cable. Lead lines 34 and 35 electrically connect the center axis of the top electrically conductive means 30 and the side electrically conductive means 31 to the cable 28, respectively.

The cable 28 in the flexible, shielded cable 15 connects the thermister 25 to the top electrically conductive means 30 and the side electrically conductive means 31, whereby changes in the resistance of the thermister 25 is introduced to a control unit described below.

The adjusting ring 22 fastens the flexible, shielded cable 15 to make a circle, thereby maintaining a preferred length of said cable 15 between the said probe 14 and jack 16.

Figure 4:
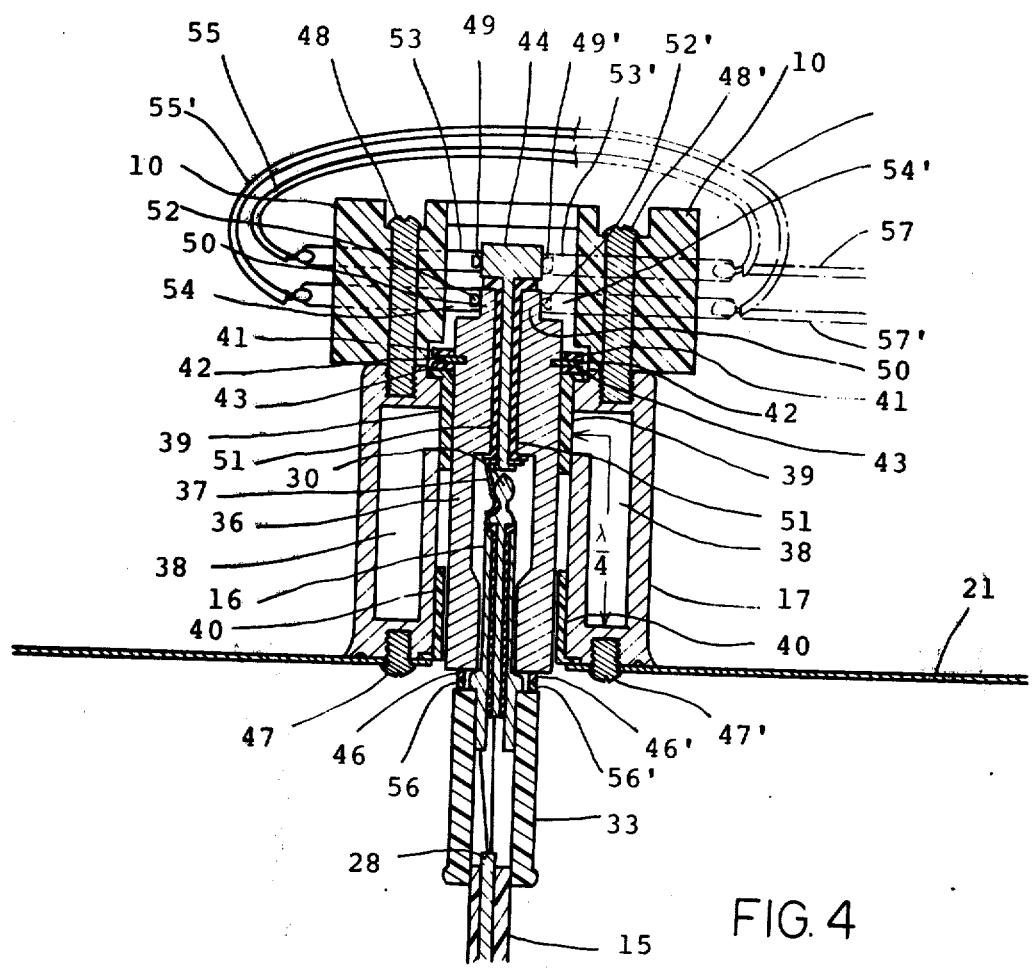
FIG. 4 is a sectional view of an embodiment of a slipping terminal unit and a slipping connector structure securing a probe jack of the present invention.

FIG. 4 shows the slipping terminal unit 10 and the slipping connector structure 17 securing the probe jack 16. The slipping connector structure 17 comprises a jack translator 36, a jack connector 37, and a choke structure 38. The slipping terminal unit 10 is provided on the slipping connector structure 17.

The probe jack 16 is inserted into the jack translator 36 which includes the jack connector 37 in a cavity thereof. The top end of the jack translator 36 reaches the center of the slipping terminal unit 10. The jack translator 36, made of the electrically conductive material such as brass, includes a top terminal 44 of electrically conductive material electrically associated with the jack connector 37. The top electrically conductive means 30 of the probe jack 16 is electrically connected with the jack connector 37 at the indent 45 thereof, when said jack 16 is inserted into the jack translator 36. Said jack 16 and said jack translator 36 are fixed to each other so as to rotate in unison. Four junction projections 46, 46', 56 and 56' are attached on said translator 36 and the jack handle 33 respectively to combine each other and stabilize the accompanied rotation.

On the other hand the side electrically conductive means 31 is electrically connected with the jack translator 36 at the lower portion of the cavity. A couple of terminals comprise the top terminal 44 and the jack translator 36 which are insulated from each other with an insulator 51.

An upper sleeve 39 and a lower sleeve 40 are arranged between the slipping connector structure 17 and the jack translator 36 to allow the rotation of the jack translator 36 and the probe jack 16 within the sleeves 39 and 40. An upper washer 41, a snap ring 42, and a lower washer 43 are provided on the upper sleeve 39 between the slipping connector structure 17 and the slipping terminal unit 10. The sleeves 39, 40 and the washers 41, 43 are made of polyacetal resin.

The slipping connector structure 17 made of an electrically conductive material includes the choke structure 38 for preventing the leakage of the microwave energy. A substantial length of the choke structure 38 is $\lambda/4$, wherein $\lambda$ is a wavelength of the microwave used in the microwave oven 1. For a microwave frequency of 2450 MHz, $\lambda$ is approximately equal to 4.8 inches, and therefore $\lambda/4$ equals approximately 1.2 inches.

The slipping connector structure 17 is mounted on the top wall 21 of the microwave oven cavity 24 with screws 47 and 47'. The slipping terminal unit 10 made of polyacetal resin is provided on the top of the slipping connector structure 17 with screws 48 and 48'. The top terminal 44 is in contact with an upper slipping terminals 49 and 49', and the jack translator 36 is in contact with a lower slipping terminals 52 and 52' at an upper portion 50 of said translator 36. Said slipping terminals 49, 49', 52, and 52' are respectively provided on upper flat spring leaves 53, 53' and lower flat spring leaves 54, 54' which are supported on the side of the slipping terminal unit 10.

The upper flat spring leaves 53 and 53' are electrically connected with each other through a lead 55, and the lower flat spring leaves 54 and 54' are electrically connected with each other by a lead 55'. Two leads 57 and 57' attached to the upper flat spring leaf 53' and the lower flat spring leaf 54' respectively are electrically associated with control circuitry to control the magnetron 2. The slipping terminal unit 10 is made of polyacetal resin, the slipping terminals 49, 49', 52 and 52' are made of metal such as carbon including silver, and the flat spring leaves 53, 53', 54, and 54' are made of phosphor bronze metal.

Figure 5:
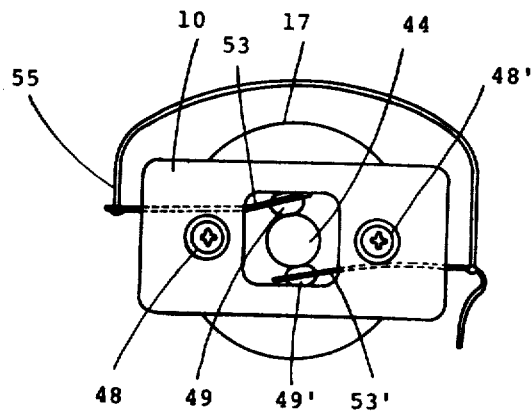
FIG. 5 is a plan view of the slipping terminal unit and the slipping connector structure shown in FIG. 4.

FIG. 5 shows a plan view of the slipping terminal unit 10 mounted on the slipping connector structure 17. The top terminal 44 is positioned in the center of the slipping terminal unit 10, said terminal 44 touching the upper slipping terminals 49 and 49'. The upper flat spring leaves 53 and 53' are distorted with the top terminal 44 which is wider than the distance provided between the leaves 53 and 53' to electrically connect the leaf 53 to the leaf 53'. Said upper flat spring leaves 53 and 53' are electrically connected with the lead 55. The slipping connector structure 17 is positioned under the slipping terminal unit 10.

Figure 6:
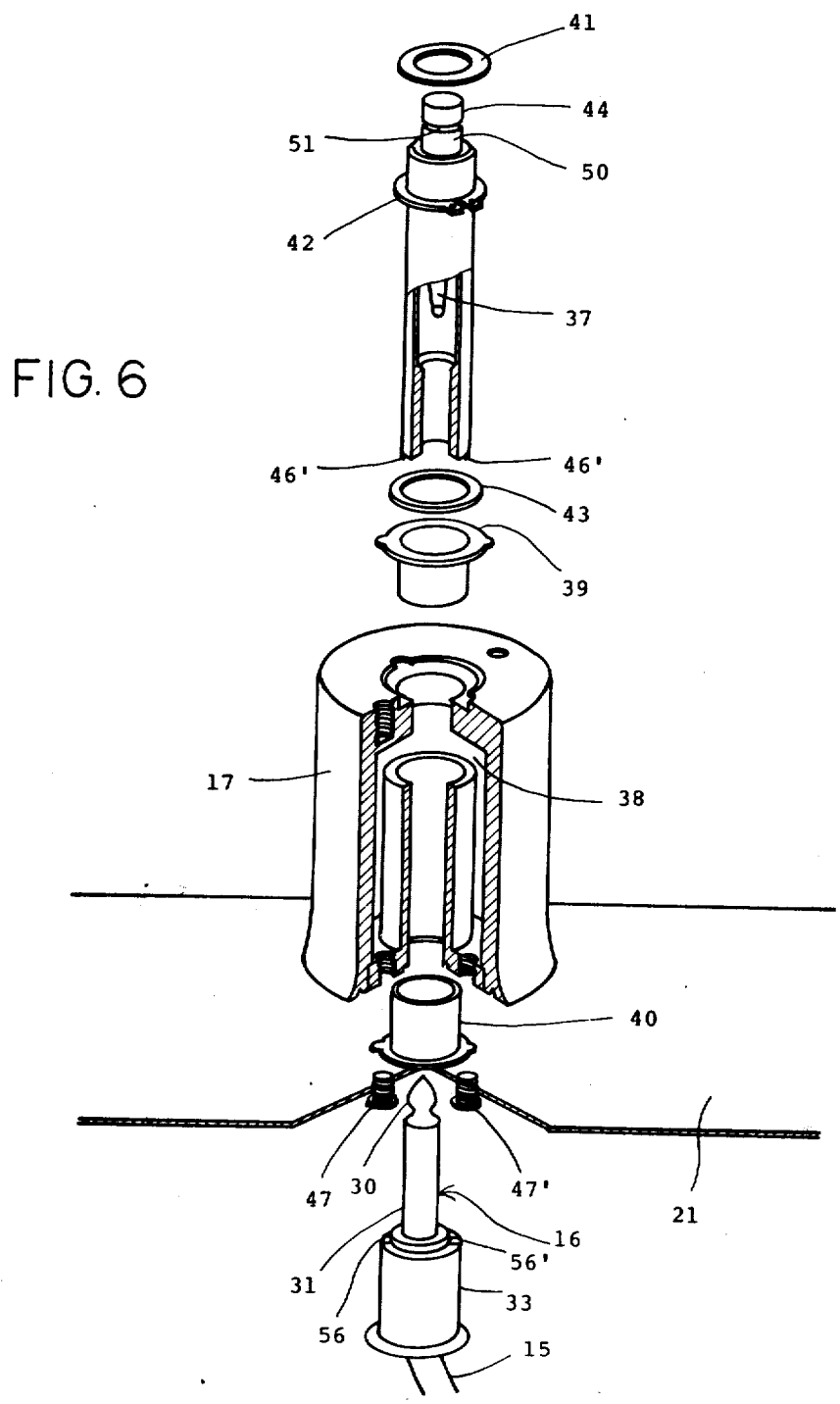
FIG. 6 is an exploded view of the slipping connector structure and the probe jack shown in FIG. 4.

FIG. 6 shows the slipping connector structure 17 securing the probe jack 16 in an exploded fashion. The slipping connector structure 17 includes the jack connector 37, the upper washer 41, the snap ring 42, the lower washer 43, the upper sleeve 39, and the lower sleeve 40. The choke structure 38 is included within the slipping connector structure 17. The probe jack 16 is inserted into the jack translator 36 within the slipping connector structure 17 for performing the electrical communication. The top electrical conductive means 30 of said jack 16 is electrically connected with the jack connector 37 within the cavity of said translator 36, and the side electrical conductive means 31 of said jack 16 is connected with said translator 36. Said jack 16 is supported by the jack handle 33 together with the flexible, shielded cable 15 and said structure 17 is arranged on the top wall 21 of the microwave oven cavity 24. The junction projections 46 and 46' are attached to the jack translator 36, the junction projections 56 and 56' are attached to the jack handle 33.

Figure 7:
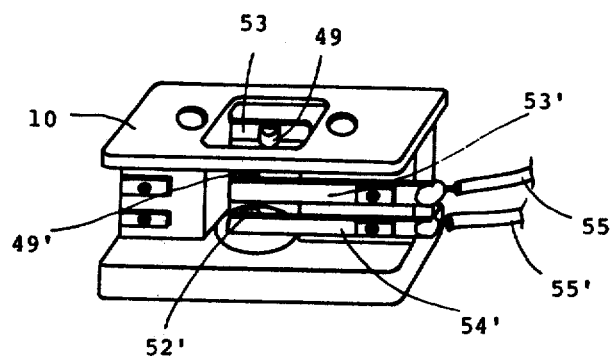
FIG. 7 is a perspective view of the slipping terminal unit shown in FIG. 4.

FIG. 7 shows the slipping terminal unit 10 including the upper flat springs 53, 53', and the lower flat spring 54', which have the upper slipping terminals 49, 49' and the lower slipping terminal 52' respectively thereon. Said upper flat spring 53 and 53' are connected with the lead 55 and the lower flat springs 54 and 54' are connected with the lead 55'.

Figure 8:
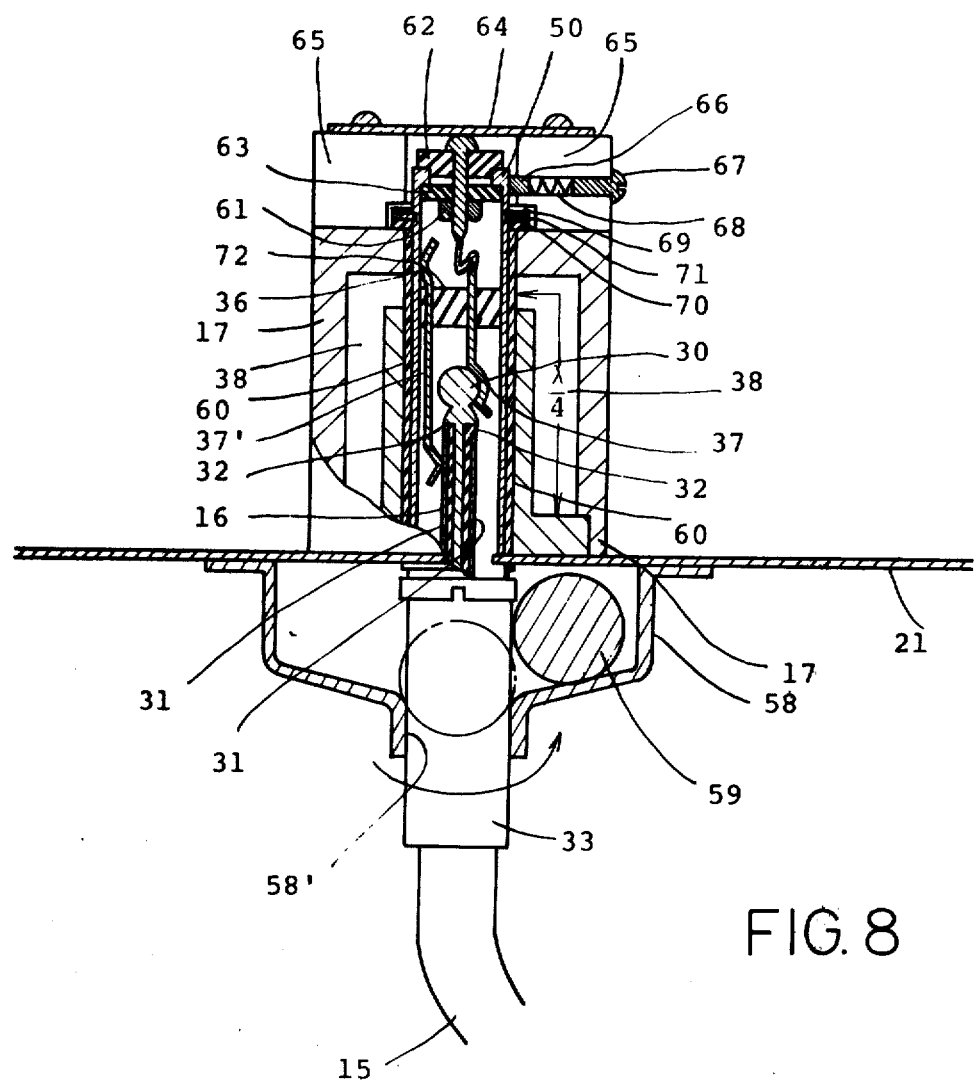
FIG. 8 is a sectional view of another embodiment of the slipping terminal unit and the slipping connector structure securing the probe jack of the present invention.

FIG. 8 shows slipping connector structure 17 securing another embodiment of the probe jack 16. When the microwave oven 1 is operated for cooking in a condition that the probe jack 16 as shown in FIG. 4 is removed from the slipping connector structure 17, the jack translator 36 of said structure 17 is directly exposed to steam or oil from the food 13 cooked in said oven 1. This causes the development of rust or dust on electrical conductive means such as the jack connector 37. Consequently, an increase of the contact resistance or production of an insulated electrical conductive member will occur. Under these conditions, an accurate transmission of the signal to the control unit 6 including control circuitry is disturbed.

A further improved embodiment of the present invention is given in FIG. 8 which eliminates the above mentioned defects. A protecting cover 58 including an opening 58' at the center thereof is disposed on the top wall 21 of the microwave oven cavity 24. The probe jack 16 and a small part of the jack handle 33 are inserted through the opening 58'. A steel ball 59 is provided in the protecting cover 58 to close the opening 58', when the probe jack 16 is not inserted into the slipping connector structure 17. When said jack 16 is inserted within said structure 17, the steel ball 59 is pushed away from said opening 58' to allow the insertion of said jack 16. The steel ball 59 is coated with polyacetal resin for protecting the steel ball 59 from rusting. The construction of the cover 58 may shut out steam or oil generated from the food 13 while it is cooked on the turntable 12 of the microwave oven 1.

In the embodiment shown in FIG. 8, the slipping connector structure 17 is tightly disposed on the top wall 21 of the microwave oven cavity 24, wherein the probe jack 16 only rotates by means of the rotation of the turntable 12 of said oven 1. The slipping connector structure 17 is arranged on the top wall 21 approximately corresponding to the center of the turntable 12. Said structure 17 includes the choke structure 38 and two jack connectors 37, 37', said connectors 37 and 37' being electrically connected with the top electrically conductive means 30 and the side electrically conductive means 31 of said jack 16, respectively. The insulator 32 in said jack 16 is held between the top electrically conductive means 30 and the side electrically conductive means 31 to insulate them. Said connectors 37, 37' are supported with a fixed means 72 made of an insulator such as phenol resin.

A sleeve 60 made of polyacetal resin is positioned outside the jack translator 36. The jack translator 36 is provided with the jack connector 37' electrically connected to the side electrically conductive means 31 of the probe jack 16. The jack connector 37 electrically connected to the top electrically conductive means 30 is suspended by a terminal screw 61 of electrically conductive means, said screw 61 combining two insulator plates 62 and 63 which support the jack translator 36. Said screw 61 is electrically connected to a plate terminal 64 supported with insulator means 65.

A carbon brush 66 of a low friction coefficient is provided so that it functions to connect the jack translator 36 to a spring 68. The carbon brush 66 is electrically connected to a screw 67 via the spring 68 included within the insulator means 65, said screw 67 and said spring 68 are made of electrically conductive material. A snap ring 71 sandwiched between two washers 69, 70 made of nylon is positioned outside the jack structure 36 which is rotatably secured in the slipping connector structure 17.

Figure 9:
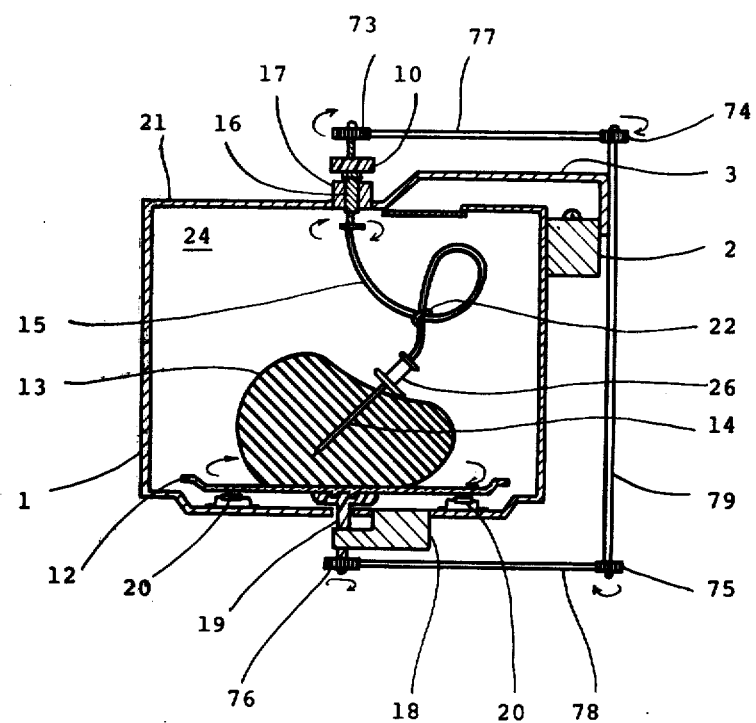
FIG. 9 is a sectional view of a microwave oven with a turntable including another embodiment of a food temperature-sensing means of the present invention.

FIG. 9 shows the microwave oven 1 including another embodiment of the slipping connector structure 17, the probe jack 16, the food temperature-sensing probe 14, and the flexible, shielded cable 15. The slipping connector structure 17 is fixed on the top wall 21 of the microwave oven cavity 24. The probe jack 16 is rotated in synchronization with the rotation of the turntable 12 via four synchronization gears 73, 74, 75, and 76 with two timing belts 77, 78, said two gears 74 and 75 being mounted on a transmission axis 79. In this embodiment the probe jack 16 combined with the synchronization gear 73 is driven to rotate by the turntable motor 18.

Figure 10:
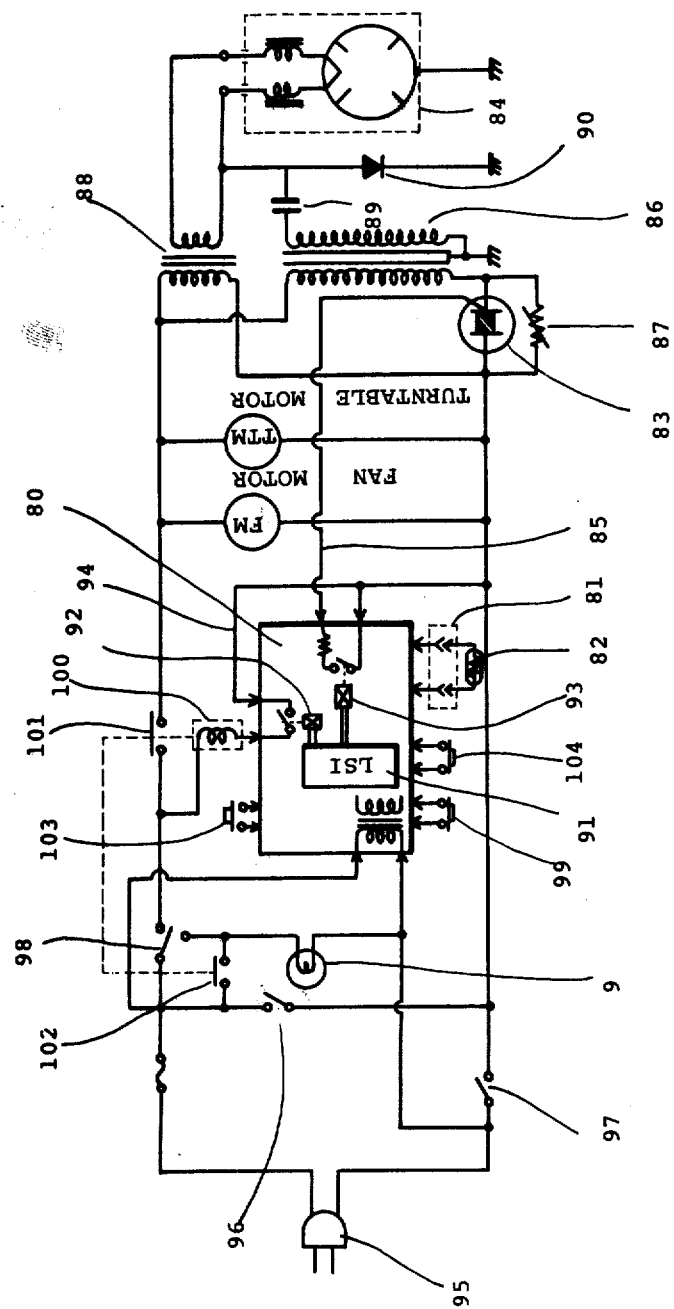
FIG. 10 is a circuit configuration employing an embodiment of a food temperature control of the present invention.

FIG. 10 shows a circuit construction of the microwave oven 1 including a control unit 80 employing a food temperature control of the food 13. The circuit mainly comprises the control unit 80, a slipping connector 81, a temperature-sensing probe 82, a triac 83, and a microwave generator including a magnetron 84. The control unit 80 includes control circuitry of Large Scale Integrated Circuit 91 etc. Two relays 92, 93 are operated by the Large Scale Integrated Circuit 91 to control a current flow of a gate line 85 and a cook relay line 94 respectively. The relay 92 is provided for switching the power supply and the relay 93 is provided for controlling the magnetron energy with ON-OFF switching. The slipping connector 81 is associated with the slipping connector structure 17, and the temperature-sensing probe 82 is associated with the food temperature-sensing probe 14. A temperature signal detected by the temperature-sensing probe 82 is introduced into the control unit 80 via the slipping connector 81, said unit 80 functioning to control a predetermined cooking temperature of the food 13 which is positioned in the microwave oven 1.

A gate signal through the gate line 85 developed from the control unit 80 triggers the triac 83 to control the microwave energy of the magnetron 84, said signal corresponds to the predetermined food temperature selected by the control panel 7. The triac 83 with a varister 87 as a protective device controls a current flow to a primary winding of a high voltage transformer 86 connected to a winding of a heater transformer 88, said transformer 86 being connected to the magnetron 84 via a capacitor 89 and a rectifier 90 for activating the magnetron 84, and said transformer 88 being connected to a filament of the magnetron 84. A power supply side includes a commercial power source 95, and a monitor switch 96 which is mechanically placed in its OFF condition when the latch door 11 is closed and is mechanically placed in its ON condition when the latch door 11 is opened. The power supply side further includes a primary interlock switch 97 and a secondary interlock switch 98, which are mechanically placed in the ON condition when the latch door 11 is closed and are mechanically placed in the OFF condition when the latch door 11 is opened through the use of the latch mechanism. That is, the interlock switches 97 and 98 function to allow the power supply to the remaining portions of the circuit only when the latch door is tightly closed.

A timer for cooking is set at a desired value through the use of the touch keys 8 included within the control panel 7. When a coil of a cook relay 100 is energized by the relay 92 which is closed by a start switch 99 on the control panel 7, the energization is held and functions to close relay contacts 101, 102. The coil of the cook relay 100 functions to close the relay contact 102 which provides a current path to the oven light 9 and to close the relay contact 101 which provides a current path to the high voltage transformer 86. A fan motor FM for driving the fan blade 4 to draw cooling air through the base of the microwave oven cavity 24 and the turntable motor TTM are further enabled.

A stop switch 103 on the control panel 7 is activated by a latch of the latch door 11. When a open lever provided on the latch door 11 is operated, the stop switch 103 opens, and the cook relay 100 is opened, which in turn, opens the cook relay contact 101 and 102 to cut off current flow to the oven light 9 and the high voltage transformer 86. When a memory start switch 104 is activated to recall information in a memory bank, a memorized program in a memory-bank is conducted.

The invention being thus described, it will be obvious that the same may be varied in many ways. Such variations are not to be regarded as a departure from the spirit and scope of the invention, and all such modifications are intended to be included within the scope of the following claims.

What is claimed is:
1. A microwave oven with a magnetron for cooking food comprising:
 a food temperature-sensing probe for monitoring an internal temperature of the food placed in the microwave oven for cooking purposes;
 a connector means provided on a wall of microwave oven cavity including a fixed connector member and a rotatable translator member;
 a communication means for electrically and mechanically connecting the food-temperature-sensing probe to said rotatable translator member; and
 a control unit for controlling magnetron energization to adjust the internal temperature of the food to a selected value in response to an output signal from the food temperature-sensing probe which is introduced into the control unit through said communication means and said connector means;
 said control unit generates a gate signal corresponding to said selected value to trigger a switching element to control magnetron energization.

2. The microwave oven of claim 1, wherein the communication means is removable from said rotatable translator member.

3. The microwave oven of claim 1, wherein the connector means comprises a protecting cover for protecting the connector means from steam or oil generated from the food while the food is cooked in the microwave oven.

4. The microwave oven of claim 1, wherein the communication means includes an adjusting means for varying the substantial distance between the food temperature-sensing probe and the connector means.

5. The microwave oven of claim 1, wherein the communication means includes a plug means coupled to said rotatable translator member which is rotatably engaged with said fixed connector member, the plug means being in contact with said rotatable translator member in at least one portion thereof.

6. A microwave oven with a magnetron for cooking food comprising:
 a turntable included in a microwave oven cavity so that the food is cooked and rotated thereon;
 a food temperature-sensing probe for monitoring an internal temperature of the food placed in the microwave oven for cooking purposes;
 a connector means provided on a top wall of a microwave oven cavity including a fixed connector member and a rotatable translator member;
 a communication means for electrically and mechanically connecting the food temperature-sensing probe to said rotatable translator member; and
 a control unit for controlling magnetron energization to adjust the internal temperature of the food to a selected value in response to an output signal from the food temperature-sensing probe which is introduced into the control unit through said communication means and said connector means;
 said control unit generates a gate signal corresponding to said selected value to trigger a switching element to control magnetron energization.

7. The microwave oven of claim 6, wherein the connector means is mounted on the top wall at the position approximately corresponding to the center of the turntable.

8. The microwave oven of claim 6, wherein the communication means is coupled to said rotatable translator member and rotatably secured in said fixed connector member to thereby rotate in accordance with the rotation of the turntable.

9. The microwave oven of claim 6, wherein the communication means includes a plug means coupled to said rotatable translator member which is rotatably engaged with said fixed connector member, the plug means being in contact with said rotatable translator member in at least one portion thereof.

10. The microwave oven of claim 6, wherein the communication means is removable from said rotatable translator member.

11. The microwave oven of claim 6, wherein the communication means includes an adjusting means for varying the substantial distance between the food temperature-sensing probe and the connector means.

12. The microwave oven of claim 6, wherein the connector means comprises a protecting cover for protecting the connector means from steam or oil generated from the food while the food is cooked in the microwave oven.

13. A microwave oven with a magnetron for cooking food comprising:
- a food temperature-sensing probe for monitoring an internal temperature of the food placed in the microwave oven for cooking purposes;
- a connector means provided on a top wall of a microwave oven cavity including a fixed connector member and a rotatable translator member;
- a communication means for electrically, mechanically and rotatably connecting the food temperature-sensing probe to said rotatable translator member; and
- a control unit for controlling magnetron energization to adjust the internal temperature of the food to a selected value in response to an output signal from the food temperature-sensing probe.

14. The microwave oven of claim 13, wherein the communication means is removable from said rotatable translator member.

15. The microwave oven of claim 13, wherein the connector means comprises a protecting cover for protecting the connector means from steam or oil generated from the food while the food is cooked in the microwave oven.

16. The microwave oven of claim 13, wherein the communication means includes an adjusting means for varying the substantial distance between the food temperature-sensing probe and the connector means.

17. The microwave oven of claim 13, wherein the communication means includes a plug means coupled to said rotatable translator member which is rotatably engaged with said fixed member, the plug means being in contact with said rotatable translator member in at least one portion thereof.

18. A microwave oven with a magnetron for cooking food comprising:
- a turntable included in a microwave oven cavity so that the food is cooked and rotated thereon;
- a food temperature-sensing probe for monitoring an internal temperature of the food placed in the microwave oven for cooking purposes;
- a connector means provided on a top wall of a microwave oven cavity including a fixed connector member and a rotatable translator member;
- a communication means for electrically, mechanically and rotatably connecting the food temperature-sensing probe to said rotatable translator member, said communication means and said rotatable translator member being driven to rotate in synchronization with the rotation of said turntable; and
- a control unit for controlling magnetron energization to adjust the internal temperature of the food to a selected value in response to an output signal from the food temperature-sensing probe.

19. The microwave oven of claim 18, wherein the connector means is mounted on the top wall at the position approximately corresponding to the center of the turntable.

20. The microwave oven of claim 18, wherein the communication means is removable from said rotatable translator member.

21. The microwave oven of claim 18, wherein the connector means comprises a protecting cover for protecting the connector means from steam or oil generated from the food while the food is cooked in the microwave oven.

22. The microwave oven of claim 18, wherein the communication means includes an adjusting means for varying the substantial distance between the food temperature-sensing probe and the connector means.

23. The microwave oven of claim 18, wherein the communication means includes a jack means coupled to said rotatable translator member and rotatably engaged with said fixed connector member, the jack means being in contact with said rotatable translator member in at least one portion thereof.

24. A temperature-sensing assembly for use in a microwave oven comprising:
- a temperature-sensing probe for monitoring an internal temperature of an object placed in a microwave oven and for producing an electrical signal representing said internal temperature of said object; and
- connecting means for electrically and mechanically connecting said temperature-sensing probe to a control means positioned exteriorly of a microwave oven cavity and being responsive to said electrical signal produced by said temperature-sensing probe, said connecting means including a connector member fixed relative to said microwave oven cavity and a movable translator member coupled to said temperature-sensing probe to permit movement of said temperature-sensing probe.

25. A temperature-sensing assembly according to claim 24, wherein said movable translator member is in contact with said fixed connector member in at least one portion thereof.

26. A temperature-sensing assembly for use in a microwave oven comprising:
- a turntable positioned within a microwave oven cavity for supporting an object;
- a temperature-sensing probe for monitoring an internal temperature of said object and for producing an electrical signal representing said internal temperature of said object; and
- connecting means for electrically and mechanically connecting said temperature-sensing probe to a control means positioned exteriorly of said microwave oven cavity and being responsive to said electrical signal produced by said temperature-sensing probe, said connector means including a connecting member fixed relative to said microwave oven cavity and a rotatable translator member rotatable with said turntable, said rotatable translator member being coupled to said temperature-sensing probe to permit rotation of said temperature-sensing probe and said rotatable translator member in accordance with said turntable, and said connecting means being positioned on a wall of said microwave oven at a position corresponding to approximately the center of said turntable.

27. A temperature-sensing assembly according to claim 24, wherein a plug means is further provided which is engaged with the movable translator member for transferring said electrical signal into said control means through said movable translator member, said plug means being in contact with said movable translator member in at least one portion thereof.

28. A temperature-sensing assembly according to claim 26, wherein a plug means is further provided which is engaged with the movable translator member for transferring said electrical signal into said control means through said movable translator member, said plug means being in contact with said movable translator member in at least one portion thereof.

* * * * *